United States Patent
Kim et al.

(10) Patent No.: US 10,120,280 B2
(45) Date of Patent: *Nov. 6, 2018

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Yongin-si, Gyeonggi-do (KR)

(72) Inventors: Sang Soo Kim, Suwon-si (KR); Jinhee Kang, Suwon-si (KR); Heekyoung Kang, Suwon-si (KR); Chang-Hyun Kwon, Suwon-si (KR); Jiyun Kwon, Suwon-si (KR); Chanwoo Kim, Suwon-si (KR); Bumjin Lee, Suwon-si (KR); Junho Lee, Suwon-si (KR); Chungbeum Hong, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/499,171

(22) Filed: Apr. 27, 2017

(65) Prior Publication Data

US 2018/0157172 A1 Jun. 7, 2018

(30) Foreign Application Priority Data

Dec. 2, 2016 (KR) .................... 10-2016-0163666

(51) Int. Cl.
| | | |
|---|---|---|
| G03F 7/028 | (2006.01) |
| G03F 7/16 | (2006.01) |
| G03F 7/20 | (2006.01) |
| G03F 7/32 | (2006.01) |
| G02F 1/01 | (2006.01) |
| H01L 51/52 | (2006.01) |
| H01L 51/00 | (2006.01) |
| G03F 7/031 | (2006.01) |
| G03F 7/037 | (2006.01) |
| G03F 7/038 | (2006.01) |
| G03F 7/039 | (2006.01) |
| G03F 7/40 | (2006.01) |
| G03F 7/00 | (2006.01) |
| H01L 27/32 | (2006.01) |

(52) U.S. Cl.
CPC ............ *G03F 7/031* (2013.01); *G02F 1/0126* (2013.01); *G03F 7/0007* (2013.01); *G03F 7/037* (2013.01); *G03F 7/038* (2013.01); *G03F 7/039* (2013.01); *G03F 7/16* (2013.01); *G03F 7/168* (2013.01); *G03F 7/2004* (2013.01); *G03F 7/322* (2013.01); *G03F 7/40* (2013.01); *H01L 27/3246* (2013.01); *H01L 51/004* (2013.01); *H01L 51/0034* (2013.01); *H01L 51/0039* (2013.01); *H01L 51/5284* (2013.01)

(58) Field of Classification Search
None
See application file for complete search history.

(56) References Cited

U.S. PATENT DOCUMENTS

| | | | | |
|---|---|---|---|---|
| 9,557,446 B2 * | 1/2017 | Kang | .................... | G03F 7/0387 |
| 2009/0292039 A1 * | 11/2009 | Sawamoto | ........... | C07D 209/88 |
| | | | | 522/50 |
| 2015/0111152 A1 * | 4/2015 | Shin | ........................ | G03F 7/105 |
| | | | | 430/281.1 |
| 2016/0047945 A1 * | 2/2016 | Qian | ........................ | G02B 1/04 |
| | | | | 522/34 |
| 2016/0377765 A1 * | 12/2016 | Kang | .................... | G03F 7/0387 |
| | | | | 430/286.1 |
| 2017/0160636 A1 * | 6/2017 | Tadokoro | ................ | G03F 7/031 |
| 2018/0017866 A1 * | 1/2018 | Kim | ........................ | G03F 7/029 |
| 2018/0088465 A1 * | 3/2018 | Kwon | ..................... | G03F 7/037 |
| 2018/0149974 A1 * | 5/2018 | Kim | ........................ | G03F 7/0048 |

FOREIGN PATENT DOCUMENTS

| | | | |
|---|---|---|---|
| JP | 2010-015025 | * | 1/2010 |
| JP | 2010-015025 A | | 1/2010 |
| JP | 2011-022384 | * | 2/2011 |
| JP | 4769461 B2 | | 9/2011 |
| JP | 2011-195736 A | | 10/2011 |
| JP | 2011-208025 A | | 10/2011 |
| JP | 4826415 B2 | | 11/2011 |
| JP | 2012-194516 A | | 10/2012 |
| JP | 5576181 B2 | | 8/2014 |
| JP | 2015-001654 A | | 1/2015 |
| JP | 2015-041104 | * | 3/2015 |

(Continued)

OTHER PUBLICATIONS

TW Office Action dated Dec. 21, 2017, of the corresponding Taiwanese Patent Application No. 106115705.

*Primary Examiner* — Martin J Angebrandt
(74) *Attorney, Agent, or Firm* — Lee & Morse, P.C.

(57) ABSTRACT

Provided are a photosensitive resin composition including (A) a binder resin; (B) a photopolymerizable monomer; (C) a photopolymerization initiator including a compound represented by Chemical Formula 1; (D) a black colorant; and (E) a solvent, a black pixel defining layer manufactured using the photosensitive resin composition, and a display device including the black pixel defining layer.

[Chemical Formula 1]

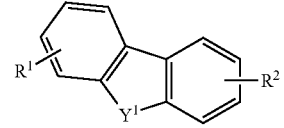

In Chemical Formula 1, each substituent is the same as defined in the detailed description.

16 Claims, No Drawings

(56) References Cited

FOREIGN PATENT DOCUMENTS

| | | | |
|---|---|---|---|
| JP | 2015-084086 A | | 4/2015 |
| JP | 5895024 B2 | | 3/2016 |
| JP | 5903164 B2 | | 4/2016 |
| JP | 5910629 B2 | | 4/2016 |
| JP | 5946657 B2 | | 7/2016 |
| JP | 2016-141770 | * | 8/2016 |
| KR | 10-2016-0025736 A | | 3/2016 |
| TW | 201345882 A | | 11/2013 |
| WO | 2010/052882 | * | 5/2010 |
| WO | 2012/147626 | * | 11/2012 |
| WO | 2014/194631 | * | 12/2014 |
| WO | 2016/076652 | * | 5/2016 |
| WO | WO 2014/024951 A1 | | 7/2016 |

* cited by examiner

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2016-0163666 filed on Dec. 2, 2016 in the Korean Intellectual Property Office, and entitled "Photosensitive Resin Composition, Black Pixel Defining Layer Using the Same and Display Device," is incorporated by reference herein in its entirety.

BACKGROUND

1. Field

This disclosure relates to a photosensitive resin composition, a black pixel defining layer using the same, and a display device.

2. Description of the Related Art

A color filter for, e.g., a color liquid crystal display and the like) may use a black photosensitive resin composition as a barrier rib material on a border between colored layers in order to increase a contrast or chromophore effect.

SUMMARY

Embodiments are directed to a photosensitive resin composition, a black pixel defining layer using the same, and a display device.

The embodiments may be realized by providing a photosensitive resin composition including a binder resin; a photopolymerizable monomer; a photopolymerization initiator including a compound represented by Chemical Formula 1; a black colorant; and a solvent,

[Chemical Formula 1]

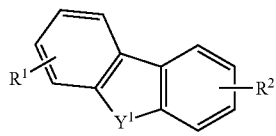

wherein, in Chemical Formula 1, $Y^1$ is $-NR^3-$ or $-CR^4R^5-$, $R^3$ to $R^5$ are each independently a substituted or unsubstituted C1 to C20 alkyl group, $R^1$ is a nitro group, and $R^2$ is a group represented by Chemical Formula 2,

[Chemical Formula 2]

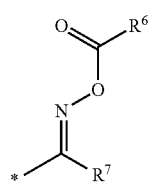

wherein, in Chemical Formula 2, $R^6$ and $R^7$ are each independently a substituted or unsubstituted C1 to C20 alkyl group, and * is a binding site to Chemical Formula 1.

The compound represented by Chemical Formula 1 may be represented by Chemical Formula 3 or Chemical Formula 4:

[Chemical Formula 3]

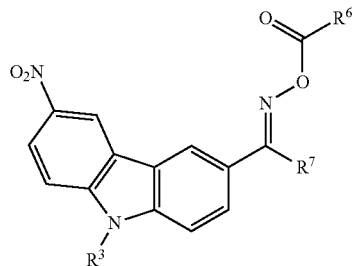

wherein, in Chemical Formula 3, $R^3$, $R^6$, and $R^7$ are each independently a substituted or unsubstituted C1 to C20 alkyl group,

[Chemical Formula 4]

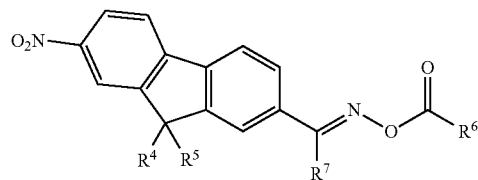

wherein, in Chemical Formula 4, $R^4$ to $R^7$ are each independently a substituted or unsubstituted C1 to C20 alkyl group.

$R^3$ may be a substituted C1 to C10 alkyl group represented by Chemical Formula 3-1 or Chemical Formula 3-2:

[Chemical Formula 3-1]

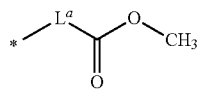

[Chemical Formula 3-2]

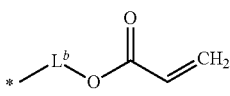

wherein, in Chemical Formula 3-1 and Chemical Formula 3-2, $L^a$ and $L^b$ are each independently a substituted or unsubstituted C1 to C10 alkylene group.

The compound represented by Chemical Formula 1 may be represented by one of Chemical Formula 1-1 to Chemical Formula 1-3:

[Chemical Formula 1-1]

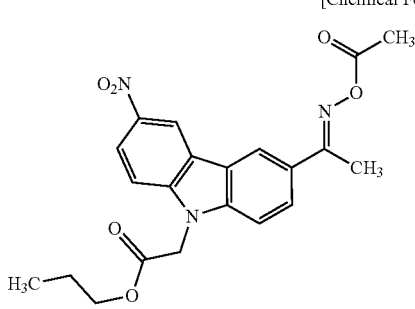

-continued

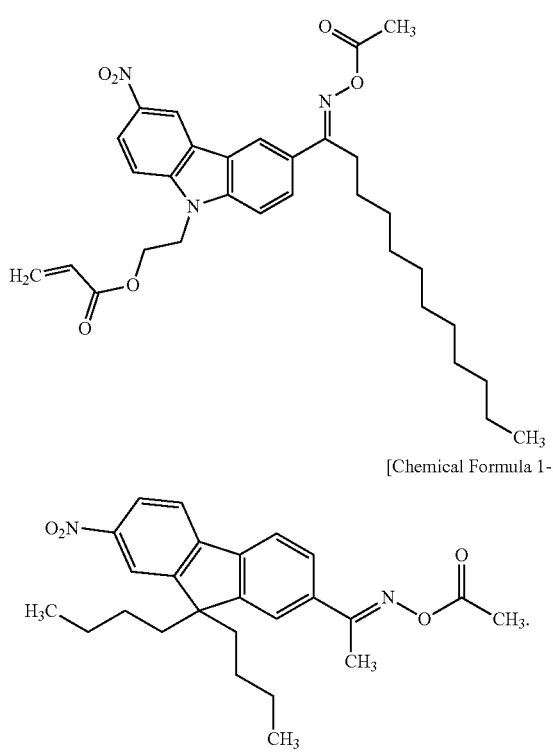

[Chemical Formula 1-2]

[Chemical Formula 1-3]

The photopolymerization initiator may further include a compound represented by Chemical Formula 5:

[Chemical Formula 5]

wherein, in Chemical Formula 5, $R^8$ to $R^{10}$ are each independently a substituted or unsubstituted C1 to C20 alkyl group, and $R^{11}$ is a substituted or unsubstituted C1 to C20 alkoxy group.

The compound represented by Chemical Formula 1 and the compound represented by Chemical Formula 5 may be included in a weight ratio of about 1:1.

The binder resin may include at least two selected from a polyamic acid-polyimide copolymer, a polyurethane resin, and a cardo binder resin.

The binder resin may include the polyamic acid-polyimide copolymer, the polyamic acid-polyimide copolymer may include a polyamic acid repeating unit and a polyimide repeating unit, and the polyamic acid repeating unit and the polyimide repeating unit may be included in a mole ratio of about 5:5 to about 9:1.

The binder resin may include the polyamic acid-polyimide copolymer, and the polyamic acid-polyimide copolymer may have a weight average molecular weight of about 3,000 g/mol to about 20,000 g/mol.

The black colorant may include an organic black pigment.

The photosensitive resin composition may include about 1 wt % to about 20 wt % of the binder resin; about 0.5 wt % to about 10 wt % of the photopolymerizable monomer; about 0.1 wt % to about 5 wt % of the photopolymerization initiator; about 1 wt % to about 20 wt % of the black colorant; and the solvent, all wt % being based on a total weight of the photosensitive resin composition.

The photosensitive resin composition may further include malonic acid, 3-amino-1,2-propanediol, a silane coupling agent, a leveling agent, a fluorine surfactant, a radical polymerization initiator, or a combination thereof.

The embodiments may be realized by providing a black pixel defining layer manufactured using the photosensitive resin composition according to an embodiment.

The embodiments may be realized by providing a display device comprising the black pixel defining layer according to an embodiment.

The display device may be an organic light emitting diode (OLED).

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to replacement of at least one hydrogen by a substituent of a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, ether group, a carboxyl group or a salt thereof, sulfonic acid group or a salt thereof, phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, the term "hetero" refers to one including at least one heteroatom selected from N, O, S and P in a chemical formula.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when specific definition is not otherwise provided, the term "combination" refers to mixing or copolymerization.

As used herein, when specific definition is not otherwise provided, an unsaturated bond includes a bond between other atoms such as a carbonyl bond, or an azo bond as well as a multi-bond between carbon-carbon atoms.

In the chemical formula of the present specification, unless a specific definition is otherwise provided, hydrogen is bonded at the position when a chemical bond is not drawn where supposed to be given.

In the present specification, a cardo resin or cardo-based resin refers to a resin including at least one functional group selected from Chemical Formula 14-1 to Chemical Formula 14-11.

As used herein, when specific definition is not otherwise provided, "*" indicates a point or location where the same or different atom or chemical formula is linked.

A photosensitive resin composition according to an embodiment may include, e.g., (A) a binder resin; (B) a photopolymerizable monomer; (C) a photopolymerization initiator including a compound represented by Chemical Formula 1; (D) a black colorant; and (E) a solvent.

[Chemical Formula 1]

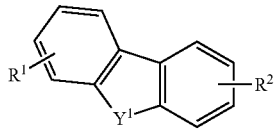

In Chemical Formula 1,
$Y^1$ may be, e.g., *—$NR^3$—* or *—$CR^4R^5$—*,
$R^3$ to $R^5$ may each independently be or include, e.g., a substituted or unsubstituted C1 to C20 alkyl group,
$R^1$ may be, e.g., a nitro group, and
$R^2$ may be, e.g., a group represented by Chemical Formula 2.

[Chemical Formula 2]

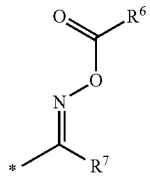

In Chemical Formula 2, $R^6$ and $R^7$ may each independently be or include, e.g., a substituted or unsubstituted C1 to C20 alkyl group.

Some planarization layer materials and/or barrier rib materials (photosensitive resin composition) may be transparent, yellowish, or reddish brown. Accordingly, these materials could exhibit deteriorating blackness of a device during the power-off, external visibility, luminance at a low angle, and the like, since incident light out from the device could be reflected by a metal layer. In addition, the planarization layer material and/or the barrier rib material may increasingly need to be black, as transparency and flexibility of the device such as an OLED and the like may be desirable.

Accordingly, a composition including a black material but forming a pattern without a residue beneath it should be developed in a negative type.

However, heat and out-gas having an influence on a life-span of a deposit material neighboring with or adjacent to a planarization layer and/or a barrier rib layer due to their characteristics may need to be controlled. For example, excellent heat resistance and low out-gas characteristics may be desirable. Accordingly, a photopolymerization initiator having high efficiency in an exposure wavelength region during exposure and high efficiency during thermal curing may be used.

According to an embodiment, a photosensitive resin composition may exhibit improved heat resistance and low out-gas characteristics and furthermore improved sensitivity by including the compound represented by Chemical Formula 1 as a photopolymerization initiator.

Hereinafter, each component is specifically described.

(C) Photopolymerization Initiator

The external light reflection may be fundamentally and effectively compensated for or eliminated by designing a photosensitive resin composition to absorb reflected light through introduction of a light-blocking material into a transparent barrier rib material. Herein, a non-light emitting region may be designed to be black, and the photosensitive resin composition may help improve a contrast ratio and visibility since light reflected from a metal layer is not transmitted and simultaneously secure a high aperture ratio.

A black photosensitive material including a light-blocking material may not sufficiently transmit light deep to the bottom and thus may be insufficiently photocured, e.g., cured on top but not cured on the bottom (unbalanced) and resultantly, may weaken developability and lack of pattern characteristics and a process margin.

In order to help strengthen the weak points of a black photosensitive resin composition, a long wavelength initiator may be applied thereto in order to sufficiently cure its deep part (deep bottom), but the black photosensitive resin composition could still be weak about sensitivity, taper characteristics, and the like.

A photosensitive resin composition according to an embodiment may include the compound represented by Chemical Formula 1 as a photopolymerization initiator.

In an implementation, the compound represented by Chemical Formula 1 may be represented by Chemical Formula 3.

[Chemical Formula 3]

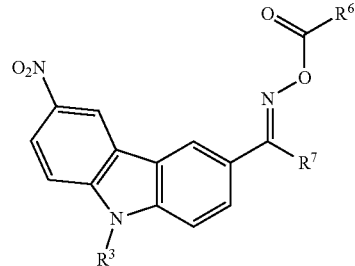

In Chemical Formula 3, $R^3$, $R^6$, and $R^7$ may each independently be or include, e.g., a substituted or unsubstituted C1 to C20 alkyl group.

In an implementation, $R^3$ may be, e.g., represented by Chemical Formula 3-1 or Chemical Formula 3-2.

[Chemical Formula 3-1]

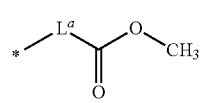

[Chemical Formula 3-2]

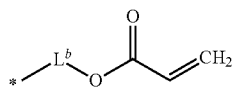

In Chemical Formula 3-1 and Chemical Formula 3-2, $L^a$ and $L^b$ may each independently be or include, e.g., a substituted or unsubstituted C1 to C10 alkylene group. For example, $R^3$ may be a substituted C1 to C10 alkyl group.

In an implementation, the compound represented by Chemical Formula 1 may be represented by Chemical Formula 4.

[Chemical Formula 4]

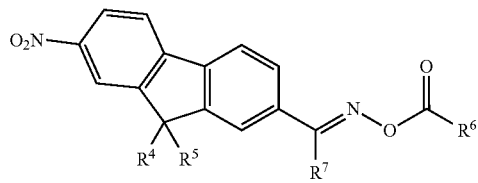

In Chemical Formula 4, $R^4$ to $R^7$ may each independently be or include, e.g., a substituted or unsubstituted C1 to C20 alkyl group.

In an implementation, the compound represented by Chemical Formula 1 may be represented by one of Chemical Formula 1-1 to Chemical Formula 1-3.

[Chemical Formula 1-1]

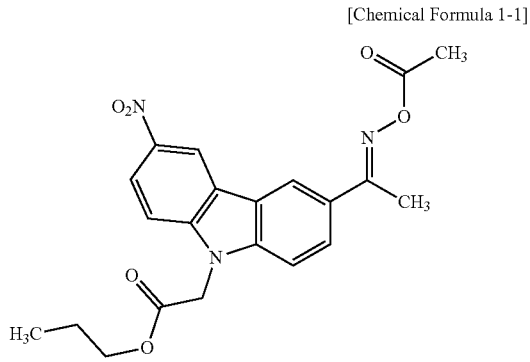

[Chemical Formula 1-2]

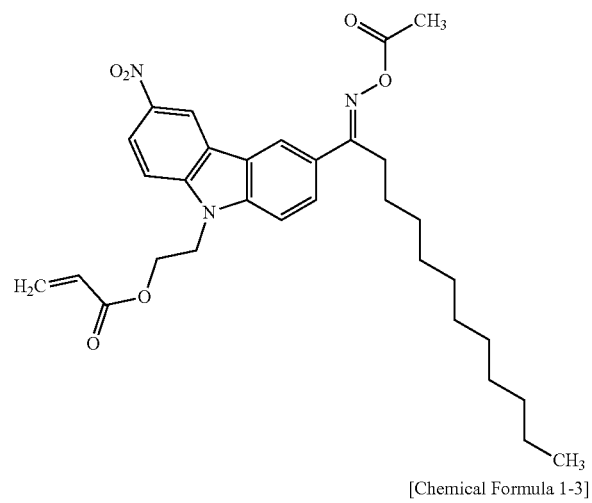

[Chemical Formula 1-3]

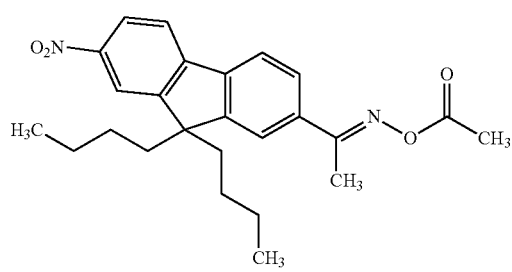

In an implementation, the photopolymerization initiator may further include, e.g., a compound represented by Chemical Formula 5.

[Chemical Formula 5]

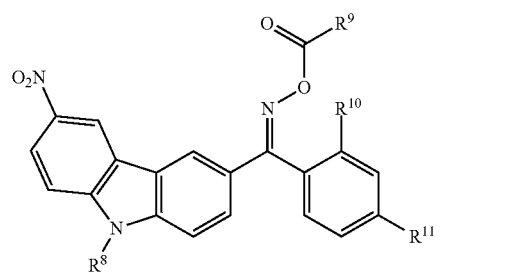

In Chemical Formula 5, $R^8$ to $R^{10}$ may each independently be or include, e.g., a substituted or unsubstituted C1 to C20 alkyl group, and $R^{11}$ may be or include, e.g., a substituted or unsubstituted C1 to C20 alkoxy group.

In an implementation, $R^{11}$ may be a group represented by Chemical Formula 5-1.

[Chemical Formula 5-1]

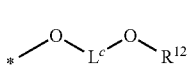

In Chemical Formula 5-1, $L^c$ may be or may include, e.g., a substituted or unsubstituted C1 to C10 alkylene group, and $R^{12}$ may be or may include, e.g., a substituted or unsubstituted C1 to C10 alkyl group.

When the photopolymerization initiator further includes the compound represented by Chemical Formula 5 with the compound represented by Chemical Formula 1, out-gas characteristic, heat resistance, and sensitivity may be further improved.

In an implementation, the compound represented by Chemical Formula 1 and the compound represented by Chemical Formula 5 may be included in a weight ratio of about 1:1.

The photosensitive resin composition according to an embodiment may be developed in a 2.38% TMAH solution so that it may be used as a black pixel defining layer material in a display device such as an organic light emitting diode (OLED) and the like.

In an implementation, the photopolymerization initiator may further include, e.g., a carbazole-based compound, a diketone-based compound, a sulfonium borate-based compound, a diazo-based compound, an imidazole-based compound, a biimidazole-based compound, or the like.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

In an implementation, the photopolymerization initiator may be included in an amount of about 0.1 wt % to about 5 wt %, e.g., about 0.3 wt % to about 3 wt %, based on a total weight of the photosensitive resin composition. When the photopolymerization initiator is included within the ranges, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

(A) Binder Resin

The photosensitive resin composition according to an embodiment may include a binder resin. In an implementation, the binder resin may include, e.g., at least two selected from a polyamic acid-polyimide copolymer, a polyurethane resin, and a cardo binder resin.

For example, the polyamic acid-polyimide copolymer may be an alkali soluble polyamic acid-polyimide copolymer.

The binder resin included in a photosensitive resin composition according to an embodiment may simultaneously have a polyimide unit having solubility in an organic solvent and a polyamic acid unit having a polyimide precursor structure and thus may provide a black pixel defining layer having high heat resistance.

The black pixel defining layer having excellent heat resistance and pattern-forming capability may be realized by copolymerizing polyimide, a main structure of a polymer in order to prevent excessive dissolution characteristics of polyamic acid, that is a polyimide precursor in an alkali aqueous solution and control solubility and thus obtaining appropriate solubility between an exposed region and a non-exposed region during a pattern formation.

For example, the polyamic acid-polyimide copolymer may include a polyamic acid repeating unit and a polyimide repeating unit, the polyamic acid repeating unit and the polyimide repeating unit may be included in a mole ratio of about 5:5 to about 9:1, e.g., about 5:5 to about 8:2, about 5:5 to about 7:3, or about 5:5 to about 6:4. When the polyamic acid repeating unit and the polyimide repeating unit are included in a mole ratio within the ranges, a step of about 1 µm may be easily realized, and a copolymerization resin having excellent cross-linking characteristics may be obtained. Maintaining the mole ratio of the polyimide repeating unit and the polyamic acid repeating unit in the copolymerization resin as described above may help ensure that developability of the composition is not deteriorated.

For example, as for the copolymer, a mole ratio of the polyimide unit already having an imidization structure in a solution state may be adjusted to easily control solubility of a photosensitive resin itself in an alkali aqueous solution. In this way, the photosensitive resin may have appropriate solubility in the alkali aqueous solution by controlling a copolymerization ratio between an alkali-soluble imide structure and a polyamic acid structure of a polyimide precursor, and excellent heat resistance may be obtained by forming a fine pattern by introducing a cross-linking functional group at the terminal end (and/or a chain) of a copolymerization resin to cross-link an exposed region when light in a UV region is radiated by a light source and developing a non-exposed region and then, thermally curing the pattern at a high temperature of greater than or equal to about 250° C.

In an implementation, the polyamic acid-polyimide copolymer may have a weight average molecular weight of about 3,000 g/mol to about 20,000 g/mol, e.g., about 5,000 g/mol to about 10,000 g/mol. When the copolymer has a weight average molecular weight within the ranges, excellent pattern-forming capability may be obtained, and a thin film may having excellent mechanical thermal characteristics may be provided.

The copolymer may have an unsaturated double bond at at least one terminal end, e.g., at both terminal ends of the copolymerization resin. In an implementation, the unsaturated double bond may be present in the middle of a chain of the copolymerization resin in addition to the terminal ends of the copolymer. The unsaturated double bond at the terminal end (and/or in the middle of a chain) may work as a cross-linking functional group and thus may help improve cross-linking characteristics of the copolymer. For example, a photosensitive resin composition having excellent contrast may be realized by introducing a monomer cross-linked by the photopolymerization initiator at the terminal end of a main structure (and/or in the middle of a chain) in order to apply cross-linking characteristics through exposure of the copolymer itself, wherein the monomer cross-linked by the photopolymerization initiator may be represented by one selected from Chemical Formula 1 to Chemical Formula 4.

In an implementation, the unsaturated double bond may be derived from, e.g., a compound selected from Chemical Formula 7 to Chemical Formula 10.

[Chemical Formula 7]

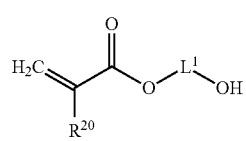

[Chemical Formula 8]

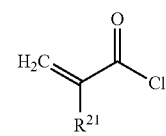

[Chemical Formula 9]

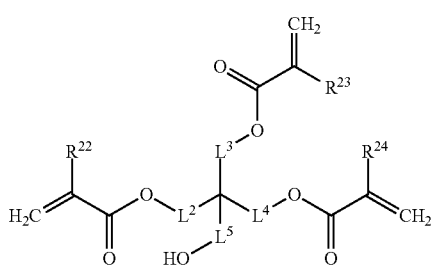

[Chemical Formula 10]

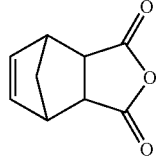

In Chemical Formula 7 to Chemical Formula 10, $R^{20}$ to $R^{24}$ may each independently be or include, e.g., a hydrogen atom or a substituted or unsubstituted C1 to C10 alkyl group, and $L^1$ to $L^5$ may each independently be or include, e.g., a single bond or a substituted or unsubstituted C1 to C10 alkylene group.

In an implementation, the copolymer may be represented by, e.g., Chemical Formula 11.

$R^{25}$ may be or may include, e.g., a substituted or unsubstituted acryl group, a substituted or unsubstituted methacryl group or a substituted or unsubstituted norbornene group, and m and n may each independently be, e.g., an integer of 1 to 100,000.

In an implementation, the tetravalent aromatic organic group may be, e.g., a group represented by Chemical Formula 12.

[Chemical Formula 12]

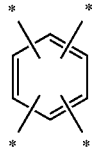

The C6 to C20 arylene group may include, e.g., a linking group represented by Chemical Formula 13.

[Chemical Formula 13]

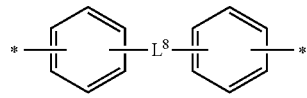

[Chemical Formula 11]

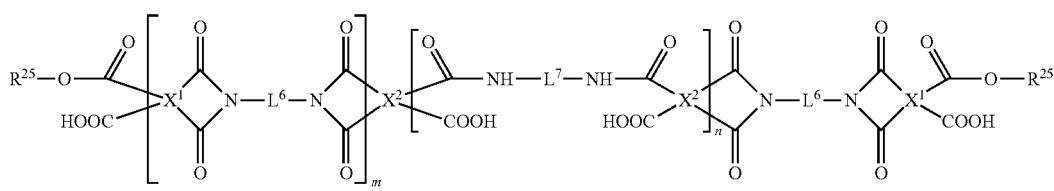

In Chemical Formula 11, $X^1$ and $X^2$ may each independently be or include, e.g., a substituted or unsubstituted tetravalent alicyclic organic group or a substituted or unsubstituted tetravalent aromatic organic group, $L^6$ and $L^7$ may each independently be or include, e.g., a single bond, a substituted or unsubstituted C1 to C10 alkylene group, a substituted or unsubstituted C3 to C10 cycloalkylene group or a substituted or unsubstituted C6 to C20 arylene group, In Chemical Formula 13, $L^8$ may be or may include, e.g., a substituted or unsubstituted C1 to C8 alkylene group.

If a binder resin were to include only a polyamic acid-polyimide copolymer, melting properties could be deteriorated. In an implementation, the binder resin may further include a polyurethane resin and/or a cardo binder resin, in addition to the polyamic acid-polyimide copolymer.

The cardo binder resin may be represented by Chemical Formula 14.

[Chemical Formula 14]

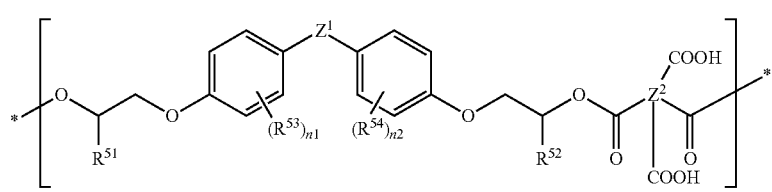

In Chemical Formula 14, $R^{51}$ and $R^{52}$ may each independently be or include, e.g., a hydrogen atom or a substituted or unsubstituted (meth)acryloyloxy alkyl group, $R^{53}$ and $R^{54}$ may each independently be or include, e.g., a hydrogen atom, a halogen atom, or a substituted or unsubstituted C1 to C20 alkyl group, and $Z^1$ may be, e.g., a single bond, O, CO, $SO_2$, $CR^{55}R^{56}$, $SiR^{57}R^{58}$ (in which $R^{55}$ to $R^{58}$ may each independently be or include, e.g., a hydrogen atom, or a substituted or unsubstituted C1 to C20 alkyl group) or a linking group represented by Chemical Formula 14-1 to Chemical Formula 14-11.

[Chemical Formula 14-1]

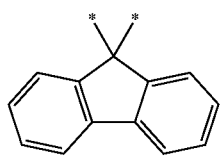

[Chemical Formula 14-2]

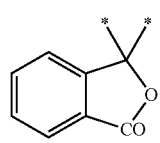

[Chemical Formula 14-3]

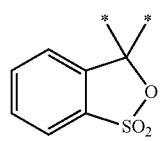

[Chemical Formula 14-4]

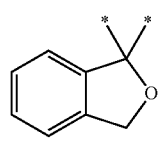

[Chemical Formula 14-5]

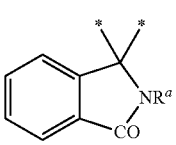

In Chemical Formula 14-5, $R^a$ may be, e.g., a hydrogen atom, an ethyl group, $C_2H_4Cl$, $C_2H_4OH$, $CH_2CH=CH_2$, or a phenyl group.

[Chemical Formula 14-6]

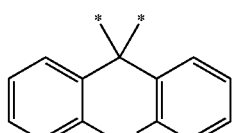

[Chemical Formula 14-7]

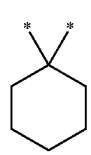

[Chemical Formula 14-8]

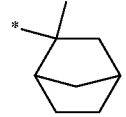

[Chemical Formula 14-9]

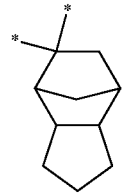

[Chemical Formula 14-10]

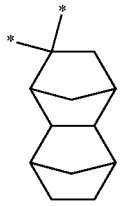

[Chemical Formula 14-11]

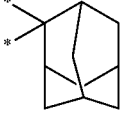

$Z^2$ may be, e.g., an acid dianhydride residual group, and n1 and n2 may each independently be, e.g., an integer of 0 to 4.

In an implementation, a weight average molecular weight of the cardo binder resin may be about 500 g/mol to about 50,000 g/mol, e.g. about 1,000 g/mol to about 30,000 g/mol. When the cardo binder resin a weight average molecular weight within the range, a pattern may be well formed without a residue during manufacture of a black pixel defining layer and without loss of a film thickness during development.

In an implementation, the cardo binder resin may include a functional group represented by Chemical Formula 15 at least one terminal end.

[Chemical Formula 15]

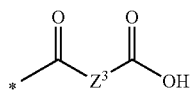

In Chemical Formula 15, $Z^3$ may be a group represented by Chemical Formula 15-1 to Chemical Formula 15-7.

[Chemical Formula 15-1]

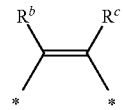

In Chemical Formula 15-1, $R^b$ and $R^c$ may each independently be or include, e.g., hydrogen, a substituted or unsubstituted C1 to C20 alkyl group, an ester group, or an ether group.

[Chemical Formula 15-2]

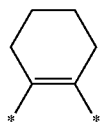

[Chemical Formula 15-3]

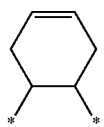

[Chemical Formula 15-4]

[Chemical Formula 15-5]

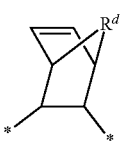

In Chemical Formula 15-5, $R^d$ may be or may include, e.g., O, S, NH, a substituted or unsubstituted C1 to C20 alkylene group, a C1 to C20 alkylamine group, or a C2 to C20 allylamine group.

[Chemical Formula 15-6]

[Chemical Formula 15-7]

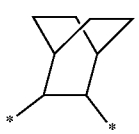

The cardo binder resin may be, e.g., prepared by mixing at least two of a fluorene-containing compound (such as 9,9-bis(4-oxiranylmethoxyphenyl)fluorene or the like); an anhydride compound (such as benzene tetracarboxylic acid dianhydride, naphthalene tetracarboxylic acid dianhydride, biphenyltetracarboxylic acid dianhydride, benzophenone tetracarboxylic acid dianhydride, pyromellitic dianhydride, cyclobutanetetracarboxylic acid dianhydride, perylenetetracarboxylic acid dianhydride, tetrahydrofuran tetracarboxylic acid dianhydride, tetrahydrophthalic anhydride, or the like); a glycol compound (such as ethylene glycol, propylene glycol, polyethylene glycol, or the like); an alcohol compound (such as methanol, ethanol, propanol, n-butanol, cyclohexanol, benzylalcohol, or the like); a solvent-based compound (such as propylene glycol methylethylacetate, N-methylpyrrolidone, or the like); a phosphorus compound (such as triphenylphosphine or the like); and an amine or ammonium salt compound (such as tetramethylammonium chloride, tetraethylammonium bromide, benzyldiethylamine, triethylamine, tributylamine, benzyltriethylammonium chloride, or the like).

If a binder resin were to include only the cardo binder resin, the composition cold be developed too fast. Thus, taper characteristics (a T-top profile is found) could be deteriorated. Accordingly, the binder resin may include the polyamic acid-polyimide copolymer in order to help prevent the deterioration of the taper characteristics.

In an implementation, the polyurethane resin may include, e.g., a repeating unit represented by Chemical Formula Y.

[Chemical Formula Y]

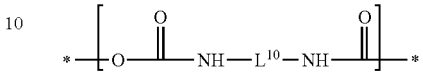

In Chemical Formula Y, $L^{10}$ may be or may include, e.g., a divalent substituted or unsubstituted C1 to C30 organic group.

For example, the $L^{10}$ may be a divalent substituted or unsubstituted C1 to C30 organic group having a heteroatom.

For example, the $L^{10}$ may be a divalent substituted or unsubstituted C1 to C30 organic group having no heteroatom.

In the binder resin, a content of the polyurethane resin or the cardo binder resin may be greater than a content of the polyamic acid-polyimide copolymer. For example, the content of the polyurethane resin or the cardo binder resin may be about 1.1 to 1.5 greater than the content of the polyamic acid-polyimide copolymer. When the content of the polyurethane resin or the cardo binder resin is greater than the content of the polyamic acid-polyimide copolymer, excellent developability and sensitivity may be obtained.

The binder resin may be included in an amount of about 1 wt % to about 20 wt %, e.g., about 3 wt % to about 15 wt %, based on the total weight of the photosensitive resin composition. When the binder resin is included within the range, improved sensitivity, developability, resolution, and pattern linearity may be obtained.

(B) Photopolymerizable Monomer

The photopolymerizable monomer in the photosensitive resin composition according to an embodiment may be a single compound or a mixture of two or more different kinds of compounds.

When the photopolymerizable monomer is the mixture of two or more kinds of compounds, one of the two kinds of compounds may be a compound including at least two functional groups represented by Chemical Formula 16.

[Chemical Formula 16]

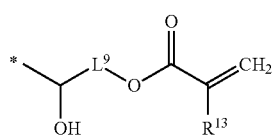

In Chemical Formula 16,
$R^{13}$ may be or may include, e.g., a hydrogen atom or a substituted or unsubstituted C1 to C10 alkyl group, and
$L^9$ may be or may include, e.g., a single bond or a substituted or unsubstituted C1 to C10 alkylene group.

For example, the compound including at least two functional groups represented by Chemical Formula 16 may include 2 to 6 functional groups represented by Chemical Formula 16. In this case, during exposure of a pattern forming process, sufficient polymerization may occur and a pattern having improved heat resistance, light resistance, and chemical resistance may be formed.

In an implementation, the compound including at least two functional groups represented by Chemical Formula 16 may be a compound represented by Chemical Formula 16-1 or Chemical Formula 16-2.

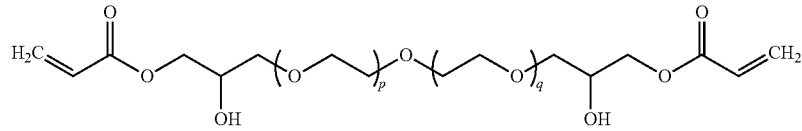

[Chemical Formula 16-1]

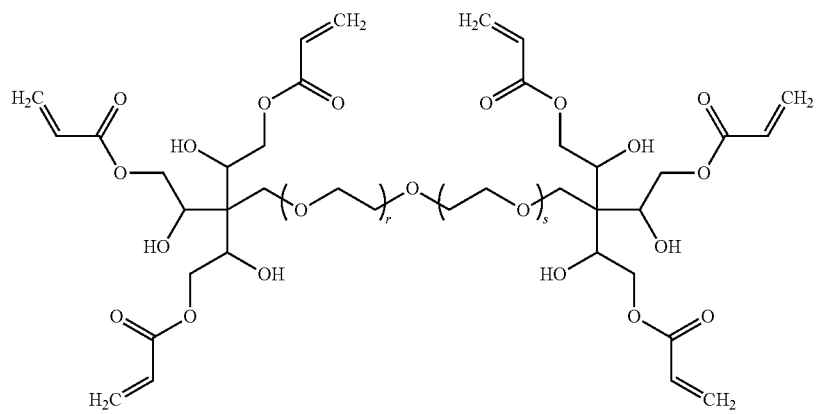

[Chemical Formula 16-2]

In Chemical Formula 16-1 and Chemical Formula 16-2, p, q, r, and s may each independently be, e.g., an integer of 1 to 10.

When the photopolymerizable monomer is a mixture of two or more kinds of compounds, the other compound of the two kinds of compounds may be a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may include, e.g., ethylene glycol di(meth)acrylate, diethylene glycol di(meth)acrylate, triethylene glycol di(meth)acrylate, propylene glycol di(meth)acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritoltri(meth)acrylate, pentaerythritoltetra(meth)acrylate, pentaerythritol hexa(meth)acrylate, dipentaerythritol di(meth)acrylate, dipentaerythritoltri(meth)acrylate, dipentaerythritolpenta(meth)acrylate, dipentaerythritol hexa(meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond may be as follows. Examples of the mono-functional (meth) acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. The products may be used alone or as a mixture of two or more.

The photopolymerizable monomer may be treated with acid anhydride to help improve developability.

The photopolymerizable monomer may be included in an amount of about 0.5 wt % to about 10 wt %, e.g., about 1 wt % to about 10 wt % or about 1 wt % to about 5 wt %, based on the total weight of the photosensitive resin composition. When the photopolymerizable monomer is included within the ranges, the reactive unsaturated compound may be sufficiently cured during exposure in a pattern-forming process and may have excellent reliability and thus, may form a pattern having excellent heat resistance, light resistance, and chemical resistance and also, excellent resolution and close-contacting properties.

(D) Black Colorant

A photosensitive resin composition according to an embodiment may include, e.g., an organic black pigment as a black colorant. The organic black pigment may include, e.g., lactam-based organic black, RGB black, RVB black, or the like.

The RGB black, RVB black, and the like indicate a pigment showing black by mixing at least two color pigments out of a red pigment, a green pigment, a blue pigment, a violet pigment, a yellow pigment, a purple pigment, and the like.

When the black colorant includes the organic black pigment, the photosensitive resin composition may have an excellent melt flow and thus realize a soft pattern having a taper angle of less than about 45° and also, may help maintain a low dielectric constant (low-k) and realize an appropriate performance as an insulation material. In addition, light-blocking properties in a visible ray region may be secured and transmittance may be also secured in a near infrared ray region so as not to be unfavorable for photocuring, and thus may be desirable or an align mark recognition.

The black colorant may have optical density of about 0.8 to about 3, e.g., about 0.8 to about 2 per 1 μm.

In an implementation, the black colorant may be used with a color calibrator such as an anthraquinone-based pigment, a perylene-based pigment, a phthalocyanine-based pigment, an azo-based pigment, or the like.

A dispersing agent may be used together in order to help improve dispersion of the black colorant such as the pigment or the color calibrator. For example, the black colorant such as the pigment or the color calibrator may be surface-pretreated with a dispersing agent, or the black colorant such as the pigment or the color calibrator and a dispersing agent may be added together during preparation of the photosensitive resin composition.

The dispersing agent may be, e.g., a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, an alkylamide alkylene oxide addition product, an alkyl amine, and the like, and may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, or PB821 made by Ajinomoto Inc.

The dispersing agent may be included in an amount of about 0.1 to about 15 wt %, based on the total weight of the photosensitive resin composition. When the dispersing agent is included within the range, the resin composition has excellent dispersibility and thus, may have excellent stability, developability, and pattern-forming capability during manufacture of a black pixel defining layer.

The black colorant such as the pigment may be pre-treated using a water-soluble inorganic salt and a wetting agent. When the black colorant such as the pigment is pre-treated, a primary particle of the pigment may become finer.

The pre-treatment may be performed by kneading the black colorant such as the pigment with a water-soluble inorganic salt and a wetting agent and then, filtering and washing the knead pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include sodium chloride, potassium chloride, and the like. The wetting agent may make the black colorant such as the pigment to be uniformly mixed with the water-soluble inorganic salt uniformly and be pulverized. Examples of the wetting agent may include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used alone or as a mixture of two or more.

For example, the black colorant such as the pigment may be used in a pigment dispersion liquid including the dispersing agent and an organic solvent, and the pigment dispersion liquid may include a solid pigment (black colorant), a dispersing agent, and an organic solvent.

The black colorant may be included in an amount of about 1 wt % to about 20 wt %, e.g., about 2 wt % to about 15 wt %, based on the total weight of the photosensitive resin composition. For example, the black colorant may be included in an amount of about 30 wt % to about 60 wt % for a reference of the pigment dispersion liquid based on the total weight of the photosensitive resin composition. When the black colorant is included within the range, luminance, color reproducibility, curability of a pattern, heat resistance, and a close-contacting force may be improved.

(E) Solvent

The solvent may be a material having compatibility with the binder resin, the pigment dispersion liquid including the black colorant, the photopolymerizable monomer, and the photopolymerization initiator, but not reacting therewith.

Examples of the solvent may include alcohols such as methanol, ethanol, and the like; ethers such as dichloroethylether, n-butylether, diisoamylether, methylphenylether, tetrahydrofuran, and the like; glycolethers such as ethylene glycolmonomethylether, ethylene glycolmonoethylether, ethylene glycoldimethylether, and the like; cellosolve acetates such as methylcellosolveacetate, ethylcellosolveacetate, diethylcellosolveacetate, and the like; carbitols such as methylethylcarbitol, diethylcarbitol, diethylene glycolmonomethylether, diethylene glycolmonoethylether, diethylene glycoldimethylether, diethylene glycolethylmethylether, diethylene glycoldiethylether, and the like; propylene glycolalkyletheracetates such as propylene glycolmethyletheracetate, propylene glycolpropyletheracetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxyacetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxymethyl propionate, 3-oxyethyl propionate, and the like; 3-alkoxy propionic acid alkyl esters such as 3-methoxymethyl propionate, 3-methoxyethyl propionate, 3-ethoxyethyl propionate, 3-ethoxymethyl propionate, and the like; 2-oxypropionic acid alkyl esters such as 2-oxymethyl propionate, 2-oxyethyl propionate, 2-oxy propyl propionate, and the like; 2-alkoxypropionic acid alkyl esters such as 2-methoxymethyl propionate, 2-methoxyethyl propionate, 2-ethoxyethyl propionate, 2-ethoxymethyl propionate, and the like; 2-oxy-2-methylpropionic acid esters such as 2-oxy-2-methylmethyl propionate, 2-oxy-2-methylethyl propionate, and the like; monooxymonocarboxylic acid alkyl esters of 2-alkoxy-2-methylpropionic acid alkyl such as 2-methoxy-2-methylmethyl propionate, 2-ethoxy-2-methylethyl propionate, and the like; esters such as 2-hydroxyethyl propionate, 2-hydroxy-2-methylethyl propionate, hydroxyl ethyl acetate, 2-hydroxy-3-methyl methyl butanoate, and the like; and ketonate esters such as ethyl pyruvate, and the like, and additionally a high boiling point solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, 3-methoxy butyl acetate, and the like.

Considering miscibility and reactivity, glycol ethers such as ethylene glycol monoethylether, ethylene glycol dimethylether, ethylene glycol diethylether, diethylene glycolethylmethylether, and the like; ethylene glycol alkyl ether acetates such as ethyl cellosolve acetate, and the like; esters such as 2-hydroxyethyl propionate, and the like; carbitols such as diethylene glycolmonomethylether, and the like; propylene glycol alkyl ether acetates such as propylene glycolmonomethyl ether acetate, propylene glycol propyletheracetate, and the like, 3-methoxy butyl acetate may be used.

The solvent may be used in a balance amount, e.g., about 40 wt % to about 60 wt % based on a total amount of the photosensitive resin composition. When the solvent is included within the range, the photosensitive resin composition may have an appropriate viscosity resulting in improvement of coating characteristics of a black pixel defining layer.

(F) Other Additives

In an implementation, the photosensitive resin composition may further include an additive of, e.g., malonic acid, 3-amino-1,2-propanediol, a silane coupling agent, a leveling agent, a fluorine surfactant, a radical polymerization initiator, or a combination thereof.

The silane coupling agent may have a reactive substituent of a vinyl group, a carboxyl group, a methacryloxy group, an isocyanate group, an epoxy group, and the like, in order to help improve close-contacting properties with a substrate.

Examples of the silane coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl) ethyltrimethoxysilane, and the like. These may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storage properties, and the like may be improved.

The photosensitive resin composition may further include a surfactant, e.g., a fluorine surfactant and/or a silicone surfactant in order to help improve coating properties and prevent a defect if necessary.

Examples of the fluorine surfactant or the leveling agent may include a commercial fluorine surfactant or leveling agent such as BM-1000®, and BM-1100® (BM Chemie Inc.); MEGAFACE F 142D®, F 172®, F 173®, F 183® and F 554® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.).

The silicone surfactant may be BYK-307, BYK-333, BYK-361N, BYK-051, BYK-052, BYK-053, BYK-067A, BYK-077, BYK-301, BYK-322, BYK-325, and the like, which are made by BYK Chem and commercially available.

The surfactant may be included in an amount of about 0.001 to about 5 parts by weight, based on 100 parts by weight of the photosensitive resin composition. When the surfactant is included within the range, excellent wetting on an IZO substrate or a glass substrate as well as coating uniformity may be secured, a stain may not be produced.

In an implementation, the photosensitive resin composition may include other additives such as an antioxidant, a stabilizer, and the like in a predetermined amount such that the additives do not deteriorate properties of the photosensitive resin composition.

The photosensitive resin composition according to an embodiment may be either positive or negative. In an implementation, the photosensitive resin composition may be negative to help completely remove residues in regions where a pattern is exposed after exposing and developing the composition having light-blocking properties.

Another embodiment provides a black pixel defining layer manufactured by exposure, development, and curing of the photosensitive resin composition.

A method of manufacturing the black pixel defining layer may be as follows.

(1) Coating and Film Formation

The photosensitive resin composition is coated to have a desired thickness on a substrate such as a glass substrate or an IZO substrate which undergoes a predetermined pretreatment, using a spin or slit coating, a roll coating method, a screen-printing method, an applicator method, and the like, and is heated at about 70° C. to about 110° C. for about 1 minute to 10 minutes to remove a solvent, forming a photosensitive resin layer.

(2) Exposure

The photosensitive resin layer may be patterned by disposing a mask and then, radiating an actinic ray ranging from about 200 nm to about 500 nm. The radiation may be performed by using a light source such as a mercury lamp with a low pressure, a high pressure, or an ultrahigh pressure, a metal halide lamp, an argon gas laser, and the like. In an implementation, an X ray, an electron beam, or the like may be used.

An exposure process may use, e.g., a light dose of about 500 mJ/cm$^2$ or less (with a 365 nm sensor) when a high pressure mercury lamp is used. In an implementation, the light dose may vary depending on kinds of each component, its combination ratio, and a dry film thickness.

(3) Development

After the exposure process, an alkali aqueous solution is used to develop the exposed film by dissolving and removing an unnecessary (or unexposed) part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment may provide a display device including the black pixel defining layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1: Synthesis of Polyamic Acid-Polyimide Copolymer 86.6 g of N-methyl-2-pyrrolidone (NMP) dissolved 12.3 g of 4,4'-(hexafluoroisopropylidene)diphthalicanhydride (6-FDA) in a four-necked flask equipped with a stirrer, a thermostat, a nitrogen gas injector, and a condenser, while nitrogen was passed through the flask. When the solid was completely dissolved, 3.25 g of 3-aminophenyl sulfone (3-DAS) was added thereto, and the mixture was stirred at ambient temperature for 2 hours. Subsequently, a temperature in the flask was increased up to 90° C., 5.6 g of pyridine and 2.05 g of acetic anhydride ($A_2CO$) were added thereto, and the obtained mixture was stirred for 3 hours. The temperature in the reactor was cooled down to ambient temperature, 1.6 g of 2-hydroethylmethacrylate (HEMA) was added thereto, and the obtained mixture was stirred for 6 hours. Subsequently, 3.25 g of 3-aminophenyl sulfone (3-DAS) was added thereto, and the obtained mixture was reacted for 6 hours, and then, the reaction was completed. The reaction mixture was put in water to produce a precipitate, and the precipitate was filtered, sufficiently cleaned with water, and dried at 50° C. under a vacuum condition for 24 hours to obtain a polyamic acid-polyimide copolymer (Polyamic acid-polyimide Copolymer 1). A weight average molecular weight of the copolymer in terms of standard polystyrene according to a GPC (Gel Permeation Chromatography) method was 7,500 g/mol, and polydispersity of the copolymer was 1.75. (A mole ratio between a polyimide unit and a polyamic acid unit: 50:50)

Synthesis Example 2: Synthesis of Compound Represented by Chemical Formula 1-1

78 mmol of aluminum chloride and 33 g of dichloroethane were put in a reactor under a nitrogen atmosphere. 36 mmol of a compound represented by Chemical Formula 1-1-b and 30 mmol of a compound represented by Chemical Formula 1-1-a were put in the same reactor, and after cooling down the reactor with an ice bath, 33 g of dichloroethane was slowly added thereto. The reaction solution was stirred at 5° C. for 30 minutes and put in ice-water for a phase-separation. Then, a solvent therein was removed to obtain an acylated intermediate. 20 mmol of the acylated intermediate were put along with 30 mmol of hydroxylamine hydrochloride and 20 g of dimethylformamide in a reactor and reacted therewith under a nitrogen atmosphere at 80° C. About two hours later, a temperature of the reactor was reduced to ambient temperature. When the phase-separation was complete, a solvent therein was removed, 28 g of butyl acetate and 24 mmol of acetic anhydride were added to the reactor, and the obtained mixture was reacted at 90° C. for about 2 hours. Subsequently, the reactor was cooled down to ambient temperature, and the reactant was neutralized with a 5% NaOH aqueous solution. After a phase-separation and a solvent removal, the resultant was recrystallized with an ethyl acetate solvent to synthesize a compound represented by Chemical Formula 1-1.

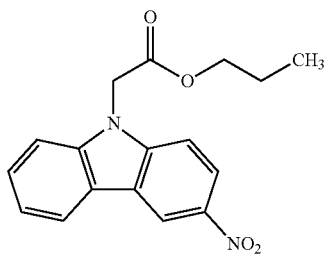

[Chemical Formula 1-1-a]

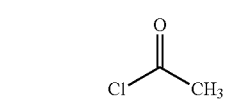

[Chemical Formula 1-1-b]

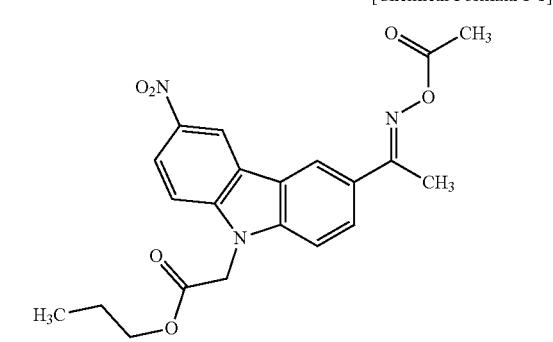

[Chemical Formula 1-1]

Maldi-tof MS: 411.41

Synthesis Example 3: Synthesis of Compound Represented by Chemical Formula 1-2

78 mmol of aluminum chloride and 33 g of dichloroethane were put in a reactor under a nitrogen atmosphere. 36 mmol of a compound represented by Chemical Formula 1-2-b and 30 mmol of a compound represented by Chemical Formula 1-2-a were put in the same reactor, and after cooling down the reactor with ice bath, 33 g of dichloroethane was slowly added to the reactor. After stirring the mixture at 5° C. for 30 minutes, the reaction solution was put in ice-water for a phase-separation. Then, a solvent therein was removed to obtain an acylated intermediate. 20 mmol of the acylated intermediate, 30 mmol of hydroxylamine hydrochloride, and 20 g of dimethylformamide were put in a reactor and reacted at 80° C. under a nitrogen atmosphere. About two hours later, a temperature in the reactor was cooled down to ambient temperature. After a phase-separation and a solvent removal, 28 g of butyl acetate and 24 mmol of acetic anhydride were added thereto, and the mixture was reacted at 90° C. for about 2 hours. After being cooled down to ambient temperature, a 5% NaOH aqueous solution was used for neutralization. After a phase-separation and a solvent removal, the resultant was recrystallized with an ethyl acetate solvent to synthesize a compound represented by Chemical Formula 1-2.

[Chemical Formula 1-2-a]

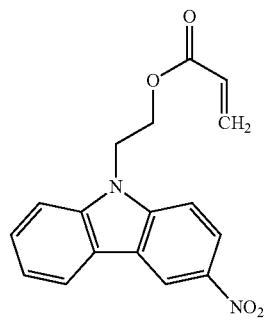

[Chemical Formula 1-2-b]

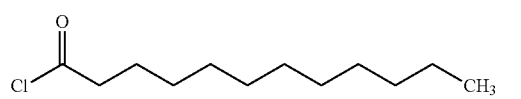

[Chemical Formula 1-2]

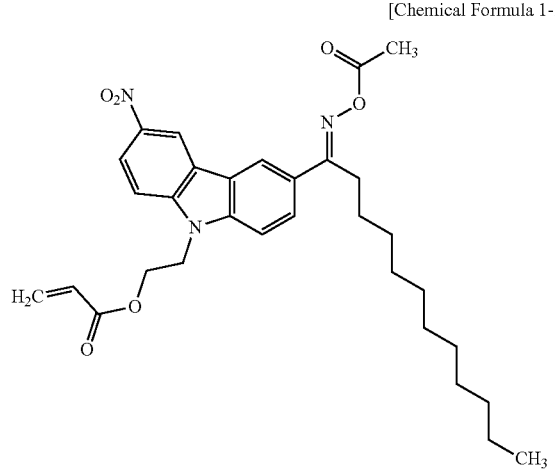

Maldi-tof MS: 549.28

Synthesis Example 4: Synthesis of Compound Represented by Chemical Formula 1-3

15 mmol of a compound represented by Chemical Formula 1-3-a was put in 200 mL of ethanol under a nitrogen atmosphere, 30 mmol of hydroxylamine hydrochloride and 30 mmol of sodium acetate were added thereto, and the mixture was refluxed and reacted for 2 hours. After cooling down the reactor to ambient temperature, 150 mL of deionized water (DIW) was added thereto, and the mixture was stirred for 30 minutes. The resultant was filtered, DIW washed, and dried to obtain an intermediate. 40 mmol of the intermediate was added to 30 mL of ethyl acetate, 5 mmol of acetic anhydride was added thereto, and the obtained mixture was reacted while heated and refluxed for 5 hours. After being cooled down to ambient temperature, the resultant was washed with 100 mL of a saturated sodium bicarbonate aqueous solution and 100 mL of DIW, treated with magnesium sulfate to remove water and evaporate a solvent, and recrystallized with methanol to synthesize a compound represented by Chemical Formula 1-3.

[Chemical Formula 1-3-a]

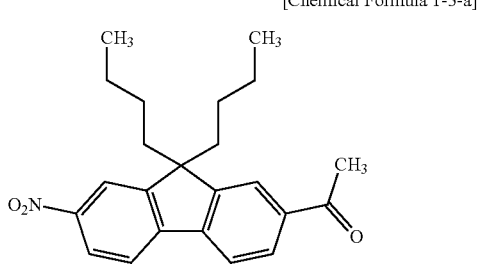

[Chemical Formula 1-3]

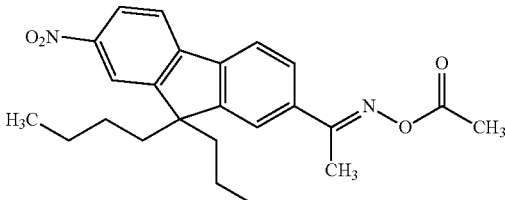

Maldi-tof MS: 420.23

(Preparation of Photosensitive Resin Composition)

Examples 1 to 11 and Comparative Examples 1 to 7

The following components were used to have compositions shown in Tables 1 and 2 to prepare photosensitive resin compositions according to Examples 1 to 11 and Comparative Examples 1 to 7.

Specifically, a photopolymerization initiator was precisely weighed, a solvent was added thereto, and the mixture was stirred until the photopolymerization initiator was completely dissolved in the solvent (greater than or equal to 30 minutes). Then, a binder resin and a photopolymerizable monomer were sequentially added thereto, and the obtained mixture was stirred again for one hour. Subsequently, a colorant (pigment dispersion liquid) was added thereto, other additives were added thereto, and the obtained mixture was finally stirred for 2 hours to prepare the photosensitive resin compositions.

Each component used in the photosensitive resin composition is as follows.

(A) Binder Resin (A-1) Polyamic acid-polyimide copolymer prepared in Synthesis Example 1

(A-2) Cardo binder resin (KBR-101, Kyung-In Corporation)

(A-3) Polyurethane binder resin (1185A, BASF)

(A-4) Polyurethane binder resin (1164D, BASF)

(A-5) Polyurethane binder resin (1180, Kuraray Inc.)

(A-6) Polyurethane binder resin (1190, Kuraray Inc.)

(A-7) Polyurethane binder resin (1195, Kuraray Inc.)

(B) Photopolymerizable Monomer (B-1) Dipentaerythritol hexa(meth)acrylate (DPHA, Sartomer)

(B-2) Compound represented by Chemical Formula A (LTM II, BASF)

[Chemical Formula A]

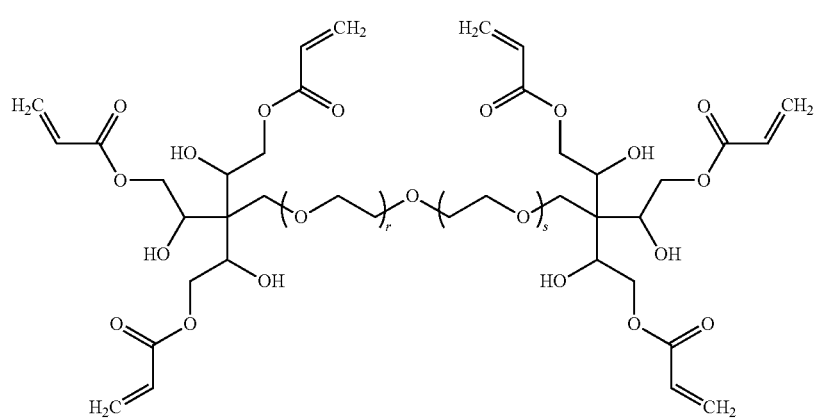

In Chemical Formula A, r and s are each independently an integer of 2.

(C) Photopolymerization Initiator (C-1) Compound prepared in Synthesis Example 2
(C-2) Compound prepared in Synthesis Example 3
(C-3) Compound prepared in Synthesis Example 4
(C-4) Compound represented by Chemical Formula B (NCI-831, Adeka Corp.)

[Chemical Formula B]

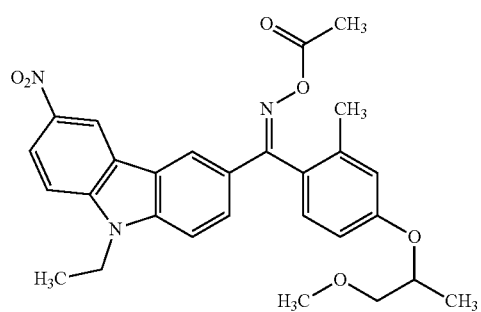

(C-5) Compound represented by Chemical Formula C (PBG-314, Tronyl)

[Chemical Formula C]

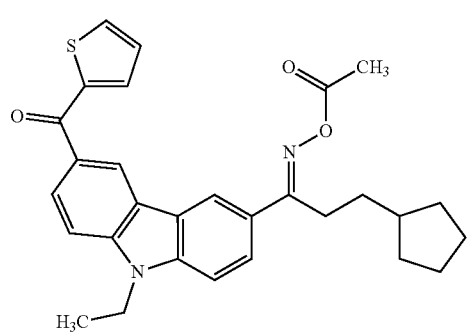

(C-6) Compound represented by Chemical Formula D (IRG-369, Basf)

[Chemical Formula D]

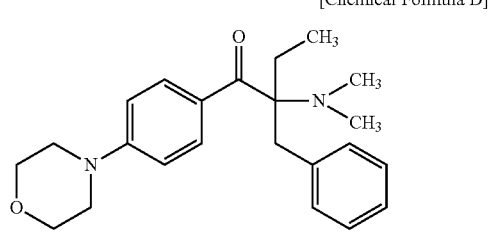

(C-7) Compound represented by Chemical Formula E (IRG-819, Basf)

[Chemical Formula E]

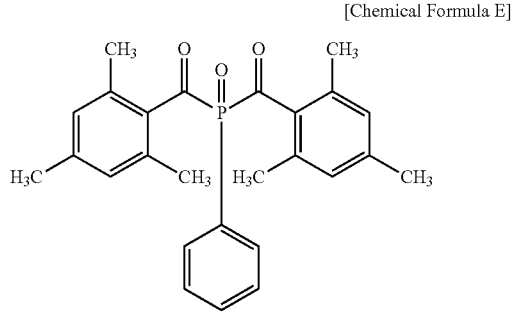

(D) Black Colorant

Organic black pigment (CIM-126) dispersion liquid (SAKATA Corp.; a solid content of organic black pigment 15 wt %)

(E) Solvent (E-1) Propylene glycol monomethyl ether acetate (PG-MEA, Sigma-Aldrich Inc.)

(E-2) 3-methoxybutyl acetate (3-MBA, Sigma-Aldrich Inc.)

(F) Other Additives

Surfactant (BYK-307, BYK Chem)

TABLE 1

(unit: g)

|  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| (A) binder resin | A-1 | 2.0 | 2.0 | 2.0 | 2.0 | 2.0 | 2.0 | 2.0 | 2.0 | 2.0 |
|  | A-2 | 2.5 | — | — | — | — | — | 2.5 | 2.5 | 2.5 |
|  | A-3 | — | 2.5 | — | — | — | — | — | — | — |
|  | A-4 | — | — | 2.5 | — | — | — | — | — | — |
|  | A-5 | — | — | — | 2.5 | — | — | — | — | — |
|  | A-6 | — | — | — | — | 2.5 | — | — | — | — |
|  | A-7 | — | — | — | — | — | 2.5 | — | — | — |
| (B) photopolymerizable monomer | B-1 | 1.0 | 1.0 | 1.0 | 1.0 | 1.0 | 1.0 | 1.0 | 1.0 | 1.0 |
|  | B-2 | 1.0 | 1.0 | 1.0 | 1.0 | 1.0 | 1.0 | 1.0 | 1.0 | 1.0 |
| (C) photopolymerization initiator | C-1 | 0.8 | — | — | — | — | — | — | — | 0.4 |
|  | C-2 | — | — | — | — | — | — | 0.8 | — | — |
|  | C-3 | — | 0.8 | 0.8 | 0.8 | 0.8 | 0.8 | — | 0.8 | — |
|  | C-4 | — | — | — | — | — | — | — | — | 0.4 |
|  | C-5 | — | — | — | — | — | — | — | — | — |
|  | C-6 | — | — | — | — | — | — | — | — | — |
|  | C-7 | — | — | — | — | — | — | — | — | — |
| (D) black colorant |  | 44.0 | 44.0 | 44.0 | 44.0 | 44.0 | 44.0 | 44.0 | 44.0 | 44.0 |
| (E) solvent | E-1 | 25.27 | 25.27 | 25.27 | 25.27 | 25.27 | 25.27 | 25.27 | 25.27 | 25.27 |
|  | E-2 | 23.4 | 23.4 | 23.4 | 23.4 | 23.4 | 23.4 | 23.4 | 23.4 | 23.4 |
| (F) other additives |  | 0.03 | 0.03 | 0.03 | 0.03 | 0.03 | 0.03 | 0.03 | 0.03 | 0.03 |

TABLE 2

(unit: g)

|  |  | Ex. 10 | Ex. 11 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|
| (A) binder resin | A-1 | 2.0 | 2.0 | 2.0 | 2.0 | 2.0 | 2.0 | 2.0 | 2.0 | 2.0 |
|  | A-2 | 2.5 | 2.5 | 2.5 | 2.5 | 2.5 | 2.5 | 2.5 | 2.5 | 2.5 |
|  | A-3 | — | — | — | — | — | — | — | — | — |
|  | A-4 | — | — | — | — | — | — | — | — | — |
|  | A-5 | — | — | — | — | — | — | — | — | — |
|  | A-6 | — | — | — | — | — | — | — | — | — |
|  | A-7 | — | — | — | — | — | — | — | — | — |
| (B) photopolymerizable monomer | B-1 | 1.0 | 1.0 | 1.0 | 1.0 | 1.0 | 1.0 | 1.0 | 1.0 | 1.0 |
|  | B-2 | 1.0 | 1.0 | 1.0 | 1.0 | 1.0 | 1.0 | 1.0 | 1.0 | 1.0 |
| (C) photopolymerization initiator | C-1 | — | — | — | — | — | — | — | — | — |
|  | C-2 | 0.4 | — | — | — | — | — | — | — | — |
|  | C-3 | — | 0.4 | — | — | — | — | — | — | — |
|  | C-4 | 0.4 | 0.4 | 0.8 | — | — | — | 0.4 | 0.4 | — |
|  | C-5 | — | — | — | 0.8 | — | — | 0.4 | — | — |
|  | C-6 | — | — | — | — | 0.8 | — | — | — | 0.4 |
|  | C-7 | — | — | — | — | — | 0.8 | — | — | — |
| (D) black colorant |  | 44.0 | 44.0 | 44.0 | 44.0 | 44.0 | 44.0 | 44.0 | 44.0 | 44.0 |
| (E) solvent | E-1 | 25.27 | 25.27 | 25.27 | 25.27 | 25.27 | 25.27 | 25.27 | 25.27 | 25.27 |
|  | E-2 | 23.4 | 23.4 | 23.4 | 23.4 | 23.4 | 23.4 | 23.4 | 23.4 | 23.4 |
| (F) other additives |  | 0.03 | 0.03 | 0.03 | 0.03 | 0.03 | 0.03 | 0.03 | 0.03 | 0.03 |

(Evaluation)

Sensitivity

The photosensitive resin compositions according to Examples 1 to 11 and Comparative Examples 1 to 7 were respectively coated on a 10 cm*10 cm ITO glass (resistance of 30Ω) and heated on a 100° C. hot plate for 1 minute in a proxy type and for 1 minute in a contact type again to form 1.2 μm-thick photosensitive resin films. The photosensitive resin films respectively coated on the substrate were exposed to light by using a mask having variously-sized patterns and changing an exposure dose with a UX-12005M-AKS02 of Ushio Inc., developed in a 2.38% TMAH solution at ambient temperature to dissolve the exposed region, and washed with pure water for 50 seconds to form a pattern.

Sensitivity was evaluated by measuring energy taken to realize a 20 μm pattern with a reference to a size of the 20 μm square pattern measured by using MX51T-N633MU of Olympus Corp., and the results are shown in Tables 3 and 4.

Heat Resistance

The photosensitive resin compositions according to Examples 1 to 11 and Comparative Examples 1 to 7 were respectively coated on a 10 cm*10 cm ITO glass (resistance of 30Ω) and heated on a 100° C. hot plate for one minute in a proxy type and for one minute in a contact type again to form 1.2 μm-thick photosensitive resin films. The photosensitive resin films coated on the substrate were exposed depending on each sensitivity and cured under a condition of 250° C./N$_2$ for 1 hour. The cured films were heated up to 250° C. at 10° C./min by using a TGA equipment, and their wt % loss was measured at 250° C. after increasing a temperature for 2 hours, and the results are shown in Tables 3 and 4.

Out-Gas

The photosensitive resin compositions according to Examples 1 to 11 and Comparative Examples 1 to 7 were respectively coated on a 10 cm*10 cm ITO glass (resistance of 30Ω) and heated on a 100° C. hot plate for 1 minute in a proxy type and for one minute in a contact type again to form 1.2 μm-thick photosensitive resin films. The photosensitive resin films respectively coated on the substrate were exposed to light depending on each sensitivity and cured under a condition of 250° C./$N_2$ for 1 hour. An out-gas amount of the cured films was measured with TD-GC/MS after capturing gas at 150° C. for 30 minutes with a Tenax tube, and the results are shown in Tables 3 and 4. Herein, a calibration curve was obtained by using toluene.

TABLE 3

|  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Sensitivity (mJ/cm$^2$) | 35 | 30 | 30 | 32 | 30 | 32 | 34 | 30 | 27 |
| Out-gas (ng/cm$^2$) | 22 | 18 | 19 | 19 | 17 | 18 | 22 | 19 | 15 |
| Heat resistance (wt %) | 4.8 | 4.6 | 4.5 | 4.5 | 4.7 | 4.5 | 4.8 | 4.5 | 4.3 |

TABLE 4

|  | Ex. 10 | Ex. 11 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|
| Sensitivity (mJ/cm$^2$) | 25 | 20 | 38 | 55 | 80 | 200 | 45 | 55 | 120 |
| Out-gas (ng/cm$^2$) | 13 | 11 | 25 | 27 | 30 | 40 | 27 | 28 | 28 |
| Heat resistance (wt %) | 4.0 | 3.8 | 5.0 | 5.5 | 5.8 | 6.0 | 5.6 | 5.6 | 5.8 |

Referring to Tables 3 and 4, a photosensitive resin composition including the compound represented by Chemical Formula 1 (and the compound represented by Chemical Formula 5) as a photopolymerization initiator showed excellent sensitivity, heat resistance, and out-gas characteristics compared with a photosensitive resin composition not including the compound as a photopolymerization initiator.

By way of summation and review, an organic light emitting diode (OLED) may include a TFT, an organic light emitting device, and an electrode supplying electricity, and herein, the TFT and the electrode may use a metal having high electrical conductivity and thus may have very high light reflectance. In addition, the barrier rib material and a planarization layer of the organic light emitting device may use an organic material having transparency or transmittance near to the transparency, an external light reflection (in which external light is reflected by a metal layer) could occur and thus hinder the organic light emitting diode (OLED) from realizing real black, and deteriorate its contrast ratio and low outdoor visibility. Accordingly, various attempts and efforts to improve the external light reflection have been considered, e.g., a method of coating a light-absorbing material on the surface of the electrode by applying a black electrode, but may raise concerns in terms of processability and reliability. In addition, a method of using an one-polarizing plate in order to reduce the external light reflection and thus increase the outdoor visibility has been considered and became commercially available but requires supply of a higher current in order to maintain luminance, since the luminance may decrease whenever even light from the organic light emitting diode (OLED) passes a polarizer, and resultantly, may deteriorate a life-span of the organic light emitting diode. Furthermore, various attempts such as a method of applying an antireflection layer to help decrease the external light reflection and improve the contrast have been considered, but the external light reflection may remain and become more serious as for a large-scaled display. For example, a black pixel defining layer may require improved heat resistance and low out-gas characteristics for processability and device reliability. Accordingly, developing a photosensitive resin composition in view of the above has been considered.

The embodiments may provide a photosensitive resin composition having improved heat resistance, sensitivity, and out-gas characteristics.

A photosensitive resin composition according to an embodiment includes a photopolymerization initiator represented by a specific chemical formula, and thereby it has improved heat resistance, sensitivity, and out-gas characteristic and may be used for manufacture of a black pixel defining layer using a black colorant.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
   a binder resin, the binder resin including a polyamic acid-polyimide copolymer that includes a polyamic acid repeating unit and a polyimide repeating unit in a mole ratio of the polyamic acid repeating unit to the polyimide repeating unit of about 5:5 to about 9:1 and that has a weight average molecular weight of about 3,000 g/mol to less than 20,000 g/mol;
   a photopolymerizable monomer;
   a photopolymerization initiator including a compound represented by Chemical Formula 1;
   a black colorant; and
   a solvent,

[Chemical Formula 1]

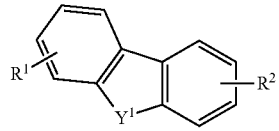

wherein, in Chemical Formula 1,
Y$^1$ is —NR$^3$— or —CR$^4$R$^5$—,
R$^3$ to R$^5$ are each independently a substituted or unsubstituted C1 to C20 alkyl group,
R$^1$ is a nitro group, and $R^2$ is a group represented by Chemical Formula 2,

[Chemical Formula 2]

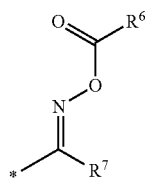

wherein, in Chemical Formula 2, $R^6$ and $R^7$ are each independently a substituted or unsubstituted C1 to C20 alkyl group, and

* is a binding site to Chemical Formula 1.

2. The photosensitive resin composition as claimed in claim 1, wherein the compound represented by Chemical Formula 1 is represented by Chemical Formula 3 or Chemical Formula 4:

[Chemical Formula 3]

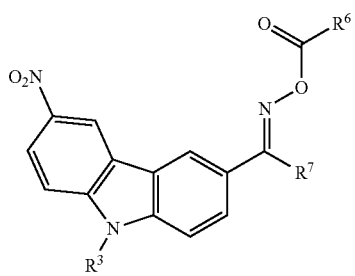

wherein, in Chemical Formula 3, $R^3$, $R^6$, and $R^7$ are each independently a substituted or unsubstituted C1 to C20 alkyl group,

[Chemical Formula 4]

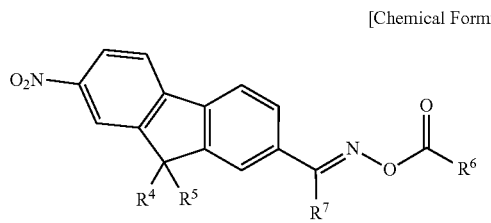

wherein, in Chemical Formula 4, $R^4$ to $R^7$ are each independently a substituted or unsubstituted C1 to C20 alkyl group.

3. The photosensitive resin composition as claimed in claim 2, wherein $R^3$ is a substituted C1 to C10 alkyl group represented by Chemical Formula 3-1 or Chemical Formula 3-2:

[Chemical Formula 3-1]

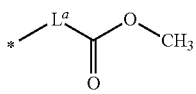

[Chemical Formula 3-2]

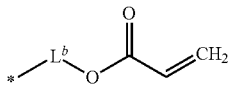

wherein, in Chemical Formula 3-1 and Chemical Formula 3-2, $L^a$ and $L^b$ are each independently a substituted or unsubstituted C1 to C10 alkylene group.

4. The photosensitive resin composition as claimed in claim 1, wherein the compound represented by Chemical Formula 1 is represented by one of Chemical Formula 1-1 to Chemical Formula 1-3:

[Chemical Formula 1-1]

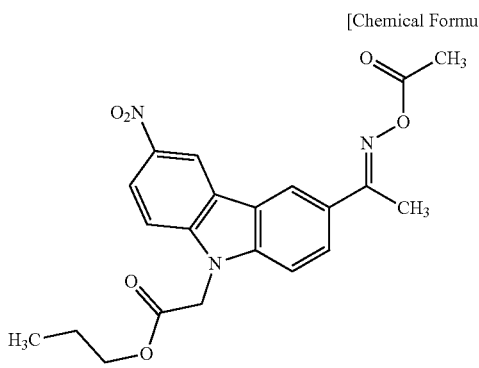

[Chemical Formula 1-2]

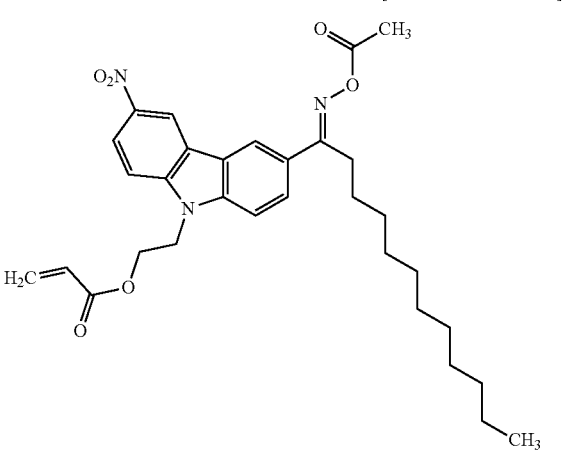

[Chemical Formula 1-3]

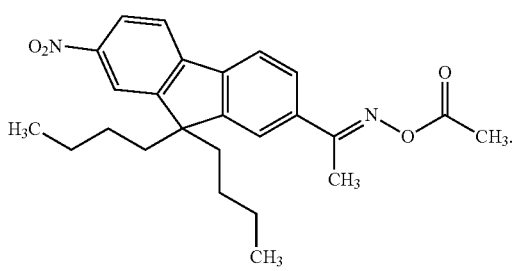

5. The photosensitive resin composition as claimed in claim 1, wherein the photopolymerization initiator further includes a compound represented by Chemical Formula 5:

[Chemical Formula 5]

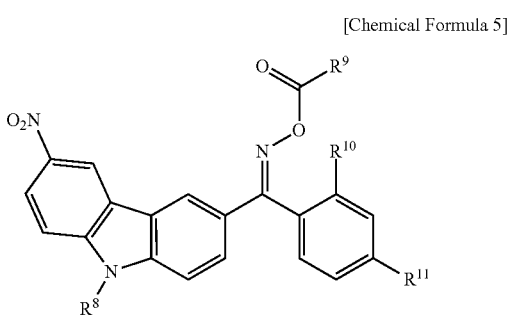

wherein, in Chemical Formula 5,
R$^8$ to R$^{10}$ are each independently a substituted or unsubstituted C1 to C20 alkyl group, and
R$^{11}$ is a substituted or unsubstituted C1 to C20 alkoxy group.

6. The photosensitive resin composition as claimed in claim 5, wherein the compound represented by Chemical Formula 1 and the compound represented by Chemical Formula 5 are included in a weight ratio of about 1:1.

7. The photosensitive resin composition as claimed in claim 1, wherein the binder resin further includes at least one of a polyurethane resin and a cardo binder resin.

8. The photosensitive resin composition as claimed in claim 1, wherein the black colorant includes an organic black pigment.

9. The photosensitive resin composition as claimed in claim 1, wherein the photosensitive resin composition includes:
    about 1 wt % to about 20 wt % of the binder resin;
    about 0.5 wt % to about 10 wt % of the photopolymerizable monomer;
    about 0.1 wt % to about 5 wt % of the photopolymerization initiator;
    about 1 wt % to about 20 wt % of the black colorant; and
    the solvent, all wt % being based on a total weight of the photosensitive resin composition.

10. The photosensitive resin composition as claimed in claim 1, wherein the photosensitive resin composition further includes malonic acid, 3-amino-1,2-propanediol, a silane coupling agent, a leveling agent, a fluorine surfactant, a radical polymerization initiator, or a combination thereof.

11. The photosensitive resin composition as claimed in claim 1, wherein the mole ratio of the polyamic acid repeating unit to the polyimide repeating unit is greater than 6:4 to about 9:1.

12. The photosensitive resin composition as claimed in claim 1, wherein the polyamic acid-polyimide copolymer has a weight average molecular weight of about 3,000 g/mol to about 10,000 g/mol.

13. A black pixel defining layer manufactured using the photosensitive resin composition as claimed in claim 1.

14. A display device comprising the black pixel defining layer as claimed in claim 13.

15. The display device as claimed in claim 14, wherein the display device is an organic light emitting diode (OLED).

16. A photosensitive resin composition, comprising:
    a binder resin, the binder resin including a polyamic acid-polyimide copolymer that has a weight average molecular weight of about 3,000 g/mol to less than 20,000 g/mol;
    a photopolymerizable monomer;
    a photopolymerization initiator including a compound represented by Chemical Formula 1;
    a black colorant; and
    a solvent,

[Chemical Formula 1]

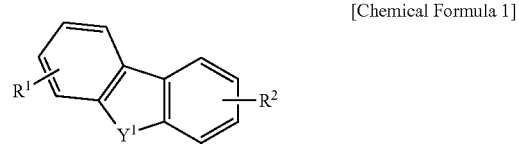

wherein, in Chemical Formula 1,
Y$^1$ is —NR$^3$— or —CR$^4$R$^5$—,
R$^3$ to R$^5$ are each independently a substituted or unsubstituted C1 to C20 alkyl group,
R$^1$ is a nitro group, and
R$^2$ is a group represented by Chemical Formula 2,

[Chemical Formula 2]

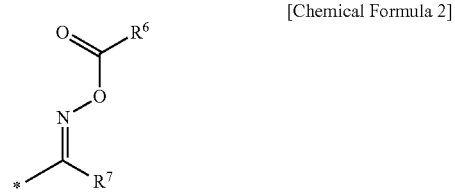

wherein, in Chemical Formula 2,
R$^6$ and R$^7$ are each independently a substituted or unsubstituted C1 to C20 alkyl group, and
is a binding site to Chemical Formula 1.

* * * * *